(12) United States Patent
Huang et al.

(10) Patent No.: US 7,977,784 B2
(45) Date of Patent: Jul. 12, 2011

(54) SEMICONDUCTOR PACKAGE HAVING REDISTRIBUTION LAYER

(75) Inventors: Chih-Yi Huang, Kaohsiung (TW); Hung-Hsiang Cheng, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 268 days.

(21) Appl. No.: 12/241,204

(22) Filed: Sep. 30, 2008

(65) Prior Publication Data
US 2009/0152721 A1   Jun. 18, 2009

(30) Foreign Application Priority Data
Dec. 18, 2007   (TW) .............................. 96148502 A

(51) Int. Cl.
*H01L 23/485* (2006.01)
(52) U.S. Cl. .... 257/700; 257/779; 257/786; 257/E23.02
(58) Field of Classification Search .................. 257/781
See application file for complete search history.

(56) References Cited

U.S. PATENT DOCUMENTS
2008/0079150 A1*  4/2008  Simon et al. .................. 257/737
* cited by examiner

*Primary Examiner* — Stephen W Smoot
(74) *Attorney, Agent, or Firm* — Volentine & Whitt, PLLC

(57) ABSTRACT

A semiconductor package and a method for making the same, whereby the semiconductor package includes a substrate, a first passivation layer, a first metal layer, a second passivation layer, and second and third metal layers. The substrate has a surface having at least first and second pads. The first passivation layer covers the surface of the substrate and exposes the first pad and the second pad. The first metal layer is formed on the first passivation layer and is electrically connected to the second pad. The second passivation layer is formed on the first metal layer and exposes the first pad and part of the first metal layer. The second metal layer is formed on the second passivation layer and is electrically connected to the first pad. The third metal layer is formed on the second passivation layer and is electrically connected to the first metal layer.

5 Claims, 6 Drawing Sheets

SEMICONDUCTOR PACKAGE HAVING REDISTRIBUTION LAYER

BACKGROUND OF THE INVENTION

1. Field of the Invention

The present invention relates to a semiconductor package and a method for making the same, and more particularly to a semiconductor package having a redistribution layer and a method for making the same.

2. Description of the Related Art

There is a tendency of making smaller and lighter electrical products, so packages with higher intensity of pins and new packaging methods are developed. Those new packaging methods include: (1) Ball Grid Array (BGA), which uses solder balls to replace conventional pins, the solder balls being connected to a circuit board and disposed in array, (2) Flip Chip, which places an active surface of a chip downward to connect the chip and the substrate by Sn/Pb bumps; (3) Quad Flat Package (QFP). Currently, the most advanced packaging technique is redistribution layer (RDL). In conventional packaging technique, a solder joint must go through the center of a chip. However, the redistribution layer redistributes a solder joint to the periphery, two sides or any side of a chip; as a result, multi-chips can be stacked perpendicularly, crisscross, or side by side.

In the design and production of the conventional redistribution layer, the power signal and the ground signal are redistributed by long and thin traces of a single-layered layout. However, when high speed and high frequency signals are transferred, the long and thin traces of the single-layered layout cannot steadily control the characteristic impedance, so a noise of power is produced and the signal is rebounded, which is the main disadvantage.

Moreover, when the numbers and the intensity of the devices in an IC chip increase, the consumption of electricity increases. Although the redistribution layer redistributes the solder joint to the periphery, two sides or any side of the chip by the long and thin traces, it causes difficulty in heat dissipation, which increases the temperature of the chip and influences the characteristic and function of the chip. Finally, it leads to lower yield rate of the chip, which is another disadvantage.

Therefore, redistributing the solder joint of the signal input and output terminal by the conventional redistribution layer with long and thin traces has the disadvantages of high parasitic impedance, lack of voltage, and uncontrolled characteristic impedance. Moreover, the long and thin traces also increase thermal resistance, and the yield rate of the chip is reduced.

SUMMARY OF THE INVENTION

The present invention provide a semiconductor package which is able to control the characteristic impedance of a high-speed and high-frequency IC chip with a redistribution layer. The present invention provides a semiconductor package which is able to reduce the parasitic impedance and the inductance value of the redistribution layer.

The present invention provides a semiconductor package which is able to reduce the thermal resistance value produced by the redistribution layer and provides a better heat dissipation path, so as to increase the reliability of the devices in the package.

The present invention provides a method for making a semiconductor package having the above-mentioned characteristics.

The present invention is directed to a semiconductor package comprising a substrate, a first passivation layer, a first metal layer, a second passivation layer, a second metal layer and a third metal layer. The substrate has a surface having at least one first pad and at least one second pad. The first passivation layer covers the surface of the substrate and exposes the first pad and the second pad. The first metal layer is formed on the first passivation layer and is electrically connected to the second pad. The second passivation layer is formed on the first metal layer and exposes the first pad and part of the first metal layer. The second metal layer is formed on the second passivation layer and is electrically connected to the first pad. The third metal layer is formed on the second passivation layer and is electrically connected to the first metal layer.

The present invention is further directed to a method for making a semiconductor package. The method comprises the following steps: (a) providing a substrate having a surface, wherein the surface has at least one first pad and at least one second pad; (b) forming a first passivation layer on the surface of the substrate, wherein the first passivation layer covers the surface of the substrate and exposes the first pad and the second pad; (c) forming a first metal layer on the first passivation layer, wherein the first metal layer is electrically connected to the second pad; (d) forming a second passivation layer on the first metal layer, wherein the second passivation layer exposes the first pad and part of the first metal layer; (e) forming a fourth metal layer on the second passivation layer; and (f) patterning the fourth metal layer, so as to form a second metal layer and a third metal layer, wherein the second metal layer is electrically connected to the first pad, and the third metal layer is electrically connected to the first metal layer.

DETAILED DESCRIPTION OF THE INVENTION

The semiconductor package and method for making the same of the present invention will be described by illustrating the following embodiments with reference to accompanying FIGS. 1 to 6. It should be noted that, "on" and "under" are used to illustrate the provisional position in the figures, not to limit the present invention.

Figure 1:
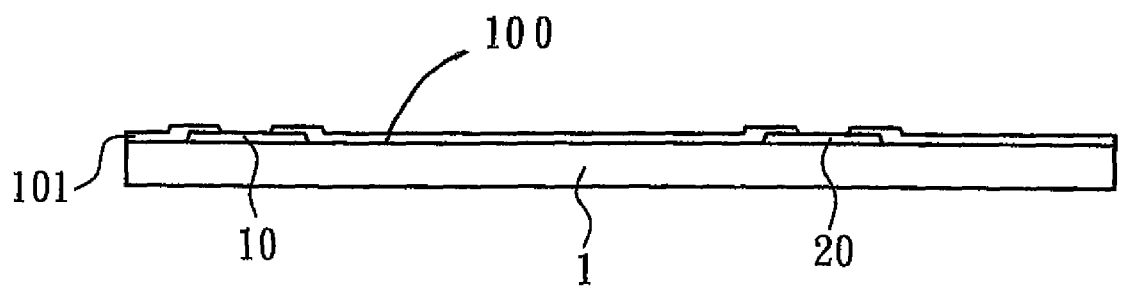
FIG. 1 is a schematic view according to a method for making a semiconductor package of the present invention after a first passivation layer is formed.

FIG. 1 shows a schematic view according to a method for making a semiconductor package of the present invention after a first passivation layer is formed. As shown in FIG. 1, a substrate 1, for example a wafer, is provided. The substrate 1 has a surface 100, which has at least one first pad 10 and at least one second pad 20 thereon. A first passivation layer 101 is then formed to cover the surface 100 of the substrate 1 and expose the first pad 10 and the second pad 20. The material of the first passivation layer 101 may be but is not limited to benzo-cyclo-butence or polyimide. The first pad 10 is a signal input and output terminal, and the second pad 20 is a ground terminal.

Figure 2:
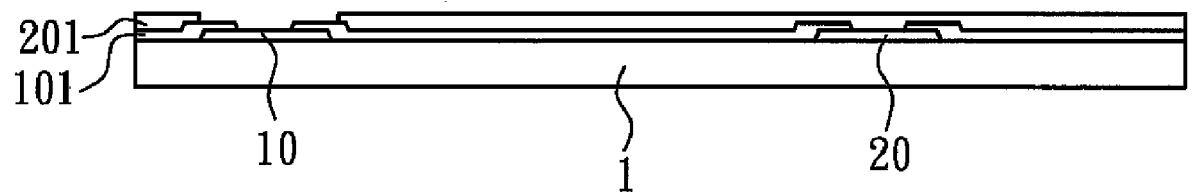
FIG. 2 is a schematic view according to the method for making a semiconductor package of the present invention after a first metal layer is formed.

As shown in FIG. 2, a first metal layer 201 is formed on the first passivation layer 101, and is electrically connected to the second pad 20. Moreover, the first metal layer 201 exposes and surrounds the first pad 10, and is electrically isolated from the first pad 10. The material of the first metal layer 201 is selected from the group consisting of Au, Ag, Cu and an alloy thereof.

Figure 3:
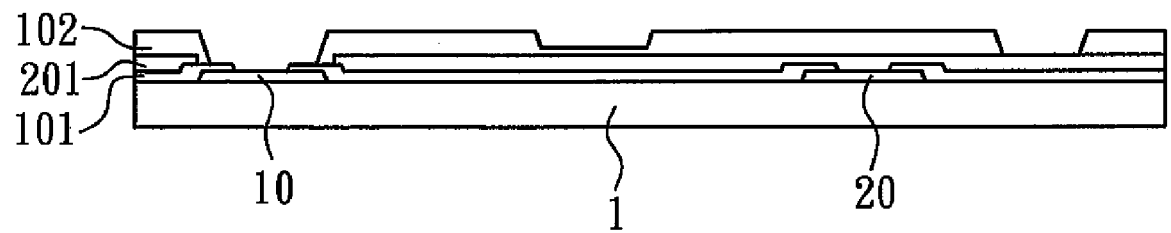
FIG. 3 is a schematic view according to the method for making a semiconductor package of the present invention after a second passivation layer is formed.

As shown in FIG. 3, a second passivation layer 102 is then formed on the first metal layer 201, and exposes the first pad 10 and part of the first metal layer 201 which surrounds the first pad 10. The material of the second passivation layer 102 may be but is not limited to benzo-cyclo-butence or polyimide.

Figure 4:
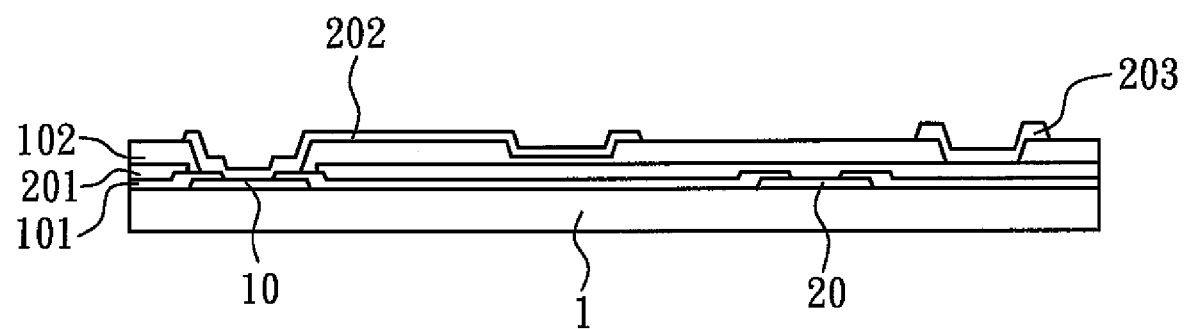
FIG. 4 is a schematic view according to the method for making a semiconductor package of the present invention after a second metal layer is formed.

As shown in FIG. 4, a second metal layer 202 is then formed on the second passivation layer 102, exposes part of the second passivation layer 102, and is electrically connected to the first pad 10. Moreover, a third metal layer 203 is formed on the second passivation layer 102, is electrically connected to the first metal layer 201, and exposes part of the second passivation layer 102. The second metal layer 202 is a redistribution layer, and the third metal layer 203 is an under bump metallurgy. The material of the second metal layer 202 and the third metal layer 203 is selected from the group consisting of Au, Ag, Cu and an alloy thereof. The second metal layer 202 and the third metal layer 203 may be formed by the following steps. First, a fourth metal layer (not shown in figure) is formed on the second passivation layer 102. Part of the fourth metal layer is then removed by patterning the fourth metal layer, and the remaining part of the fourth metal layer on the second passivation layer 102 forms the second metal layer 202 and the third metal layer 203.

Figure 5:
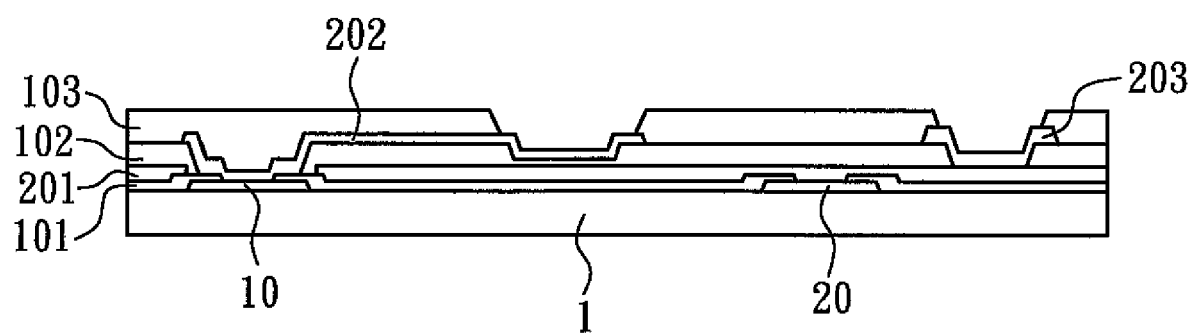
FIG. 5 is a schematic view according to the method for making a semiconductor package of the present invention after a third passivation layer is formed.

As shown in FIG. 5, a third passivation layer 103 is then formed on the second passivation layer 102. The third passivation layer 103 covers the exposed part of the second passivation layer 102, the second metal layer 202 and the third metal layer 203, and exposes part of the second metal layer 202 and part of the third metal layer 203. The material of the third passivation layer 103 may be but is not limited to benzo-cyclo-butence or polyimide.

Figure 6:
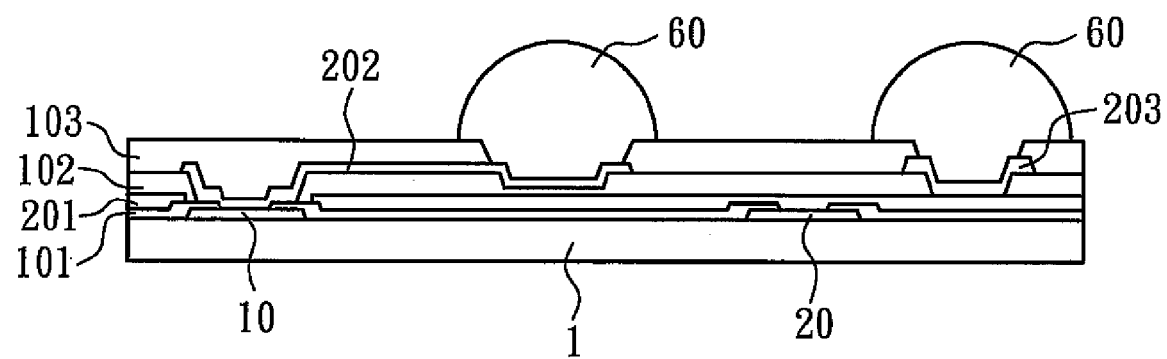
FIG. 6 is a schematic view of a semiconductor package formed by the method of the present invention.

FIG. 6 shows a schematic view of a semiconductor package formed by the method of the present invention. The semiconductor package is formed by disposing a Pb/Sn bump 60 on a semi-finished semiconductor package as shown in FIG. 5, and the Pb/Sn bump 60 is disposed on the exposed part of the second metal layer 202 and the exposed part of the third metal layer 203.

As described above, the present invention provides a semiconductor package which is able to control the characteristic impedance of a high-speed and high-frequency IC chip with a redistribution layer, and a method for making the same.

Moreover, the semiconductor package and a method for making the same of the present invention are able to reduce the parasitic impedance and the inductance value of the redistribution layer. In addition, the design of the present invention is able to reduce the thermal resistance value produced by the redistribution layer and provide a better heat dissipation path, so as to increase the reliability of the devices in the package.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A semiconductor package, comprising:
a substrate, having a surface, wherein the surface has at least one first pad and at least one second pad;
a first passivation layer, covering the surface of the substrate and exposing the first pad and the second pad;
a first metal layer, formed on the first passivation layer and electrically connected to the second pad, wherein the first metal layer exposes and surrounds the first pad, and is electrically isolated from the first pad;
a second passivation layer, formed on the first metal layer and exposing the first pad and part of the first metal layer;
a second metal layer, formed on the second passivation layer and electrically connected to the first pad; and
a third metal layer, formed on the second passivation layer and electrically connected to the first metal layer.

2. The semiconductor package as claimed in claim 1, wherein a third passivation layer is formed on the second passivation layer, the third passivation layer covering the second passivation layer, the second metal layer and the third metal layer and exposing part of the second metal layer and part of the third metal layer.

3. The semiconductor package as claimed in claim 1, wherein the material of the first metal layer is selected from the group consisting of Au, Ag, Cu and an alloy thereof.

4. The semiconductor package as claimed in claim 1, wherein the first pad is a signal input and output terminal.

5. The semiconductor package as claimed in claim 1, wherein the second pad is a ground terminal.

* * * * *